United States Patent
Lin et al.

(10) Patent No.: US 12,176,409 B2
(45) Date of Patent: Dec. 24, 2024

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Ming-Ching Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 555 days.

(21) Appl. No.: 17/461,536

(22) Filed: Aug. 30, 2021

(65) Prior Publication Data

US 2023/0068279 A1   Mar. 2, 2023

(51) Int. Cl.
  *H01L 29/423* (2006.01)
  *H01L 21/8234* (2006.01)
  *H01L 29/06* (2006.01)
  *H01L 29/66* (2006.01)
  *H01L 29/786* (2006.01)

(52) U.S. Cl.
  CPC .......... *H01L 29/42392* (2013.01); *H01L 21/823418* (2013.01); *H01L 29/0649* (2013.01); *H01L 29/66545* (2013.01); *H01L 29/66742* (2013.01); *H01L 29/78618* (2013.01); *H01L 29/78696* (2013.01)

(58) Field of Classification Search
  CPC ....... H01L 29/42392; H01L 21/823418; H01L 29/0649; H01L 29/66545; H01L 29/66742; H01L 29/78618; H01L 29/78696; H01L 29/0673; H01L 21/823425; H01L 27/088; H01L 29/66439; H01L 29/775; B82Y 10/00
  See application file for complete search history.

(56) References Cited

U.S. PATENT DOCUMENTS

| | | | |
|---|---|---|---|
| 12,051,737 B2 * | 7/2024 | Wang | H01L 21/823431 |
| 2023/0063087 A1 * | 3/2023 | Lin | H01L 29/66439 |
| 2023/0064705 A1 * | 3/2023 | Chang | H01L 27/0688 |
| 2023/0067425 A1 * | 3/2023 | Lin | H01L 29/0673 |

* cited by examiner

*Primary Examiner* — Douglas W Owens
(74) *Attorney, Agent, or Firm* — FOLEY & LARDNER LLP

(57) ABSTRACT

A semiconductor device includes an active gate structure extending along a first lateral direction. The semiconductor device includes an inactive gate structure also extending along the first lateral direction. The semiconductor device includes a first epitaxial structure disposed between the active gate structure and the inactive gate structure along a second lateral direction perpendicular to the first lateral direction. The active gate structure wraps around each of a plurality of channel layers that extend along the second direction, and the inactive gate structure straddles a semiconductor cladding layer that continuously extends along a first sidewall of the first epitaxial structure and across the plurality of channel layers.

20 Claims, 16 Drawing Sheets

SEMICONDUCTOR DEVICES AND METHODS OF MANUFACTURING THEREOF

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
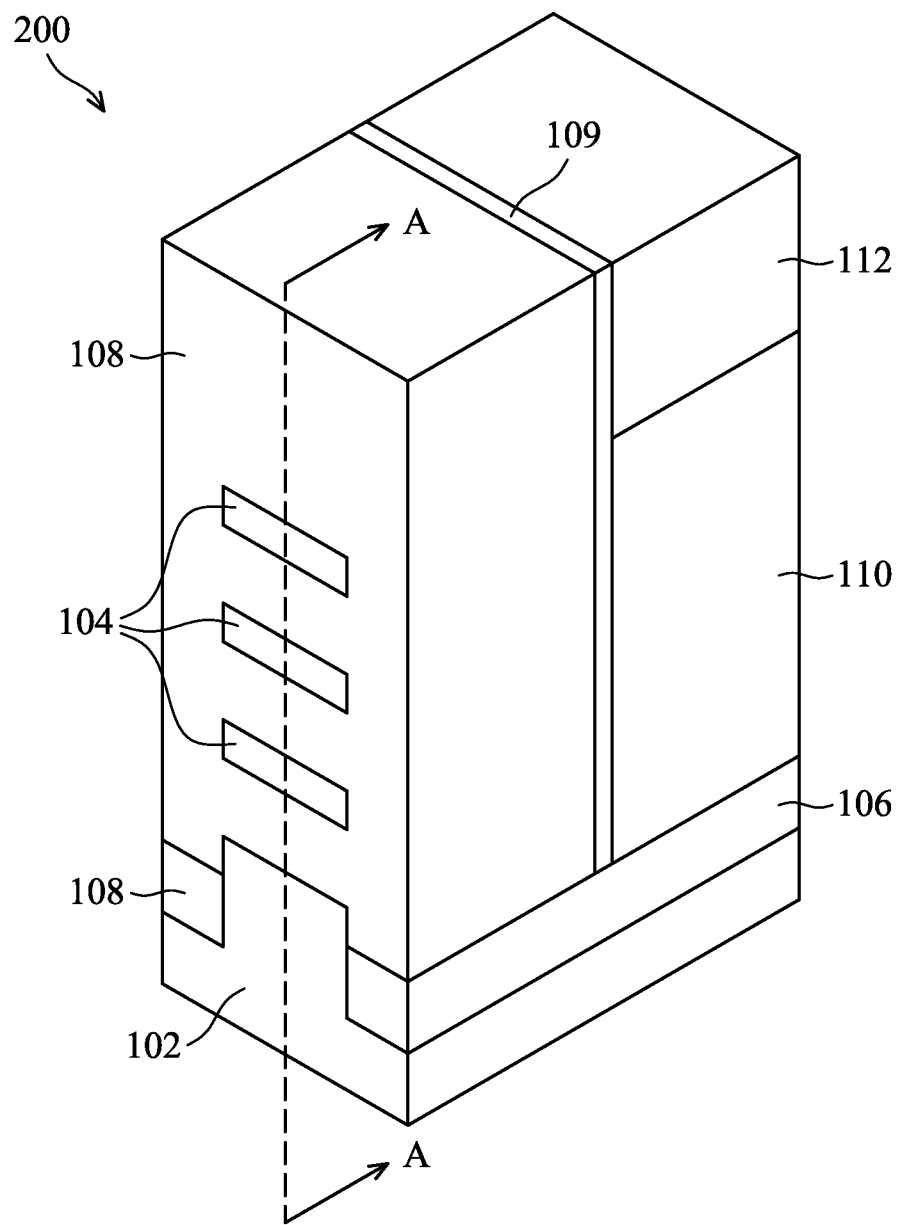
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit typically includes a large number of devices (e.g., transistors). To fabricate these devices, a number of active structures and a number of gate structures that intersect the active structures can be formed on a substrate or wafer to define such devices. In contemporary semiconductor device fabrication processes, such active fin structures may be implemented as non-planar (e.g., fin-based) structures, thereby forming a number of fin-based transistors, which can provide increased device density and increased performance over planar transistors.

Some advanced non-planar transistor architectures, such as nanostructure transistors, can further increase the performance over fin-based transistors. Example nanostructure transistors include nanosheet transistors, nanowire transistors, and the like. The nanostructure transistor typically includes a number of channel layers, collectively configured as a conduction channel of the transistor, that are fully wrapped by a gate structure. In comparison with the fin-based transistors where the channel is partially wrapped by a gate structure, the nanostructure transistor, in general, includes at least one gate structure that wraps around a full perimeter of each of the channel layers. Accordingly, such transistors may sometimes be referred to as gate-all-around (GAA) transistors. With such a gate-all-around feature, the GAA transistor can further improve the control of a conduction channel over the fin-based transistor, thus causing, for example, a relatively large driving current given the similar size of the fin-based transistor and nanostructure transistor.

In existing technologies for making GAA transistors, a source/drain structure is epitaxially grown from the respective exposed sidewalls of a number of channel layers, which may respectively belong to two adjacent stacks (or conduction channels). A contact area for growing the source/drain structure that such channel layers can provide may be limited, for example, when the dimensions of the channel layers further shrink. As a result, performance of the GAA transistor can be adversely impacted.

In advanced technology nodes, to further configure a number of transistors to operate as certain circuits, some of the transistors can be operatively connected to or disconnected from each other. For example, some of the active structures (each of which includes a stack of channel layers) may be cut or otherwise disconnected for facilitating the overall design of an integrated circuit. As such, some of the gate structures, in addition to overlaying a top surface of the cut active structure, may extend along an edge of the cut active structure. Such gate structure that extends along the edge of a cut active structure may sometimes be referred to as a poly-oxide diffusion-edge (PODE). Typically, these gate structures may not serve as active gate structure (sometimes referred to as inactive gate structures).

Embodiments of the present disclosure are discussed in the context of forming a non-planar transistor device (e.g., a GAA transistor), and in particular, in the context of epitaxially growing a source/drain structure for a GAA transistor between two asymmetric sidewalls. For example, by forming a semiconductor cladding layer that extends along the cut edge (or sidewall) of a stack of channel layers, a dummy gate structure, which is to be replaced with an inactive gate structure, can be formed over the semiconductor cladding layer. Accordingly, when etching the stack to form a source/drain recess (where the source/drain structure to be formed), the source/drain recess can have two asymmetric sidewalls to allow the source/drain structure to epitaxially grown thereon. In some embodiments, one of the sidewalls may be constituted by respective sidewalls of channel layers of the stack, and the other sidewall may be constituted by a continuously extending sidewall of the semiconductor cladding layer, which can significantly increase the contact area for growing the source/drain structure. Consequently, the above-identified issues that the existing technologies face can be advantageously avoided.

FIG. 1 illustrates a perspective view of an example GAA transistor 100, in accordance with various embodiments. The GAA transistor 100 includes a substrate 102 and a number of semiconductor/channel layers (e.g., nanosheets, nanowires, or otherwise nanostructures) 104 above the substrate 102. The semiconductor layers 104 are vertically separated from one another, which can collectively function as a (conduction) channel of the GAA transistor 100. Isolation regions/structures 106 are formed on opposing sides of a protruding portion of the substrate 102, with the semiconductor layers 104 disposed above the protruding portion. A gate structure 108 wraps around each of the semiconductor layers 104 (e.g., a full perimeter of each of the semiconductor layers 104). A spacer 109 extends along each sidewall of the gate structure 108. Source/drain structures are disposed on opposing sides of the gate structure 108 with the spacer 109 disposed therebetween, e.g., source/drain structure 110 shown in FIG. 1. An interlayer dielectric (ILD) 112 is disposed over the source/drain structure 110.

The GAA transistor shown in FIG. 1 is simplified, and thus, it should be understood that one or more features of a completed GAA transistor may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the semiconductor layers 104 and in a direction of a current flow between the source/drain structures. Subsequent figures may refer to this reference cross-section for clarity.

Figure 2:
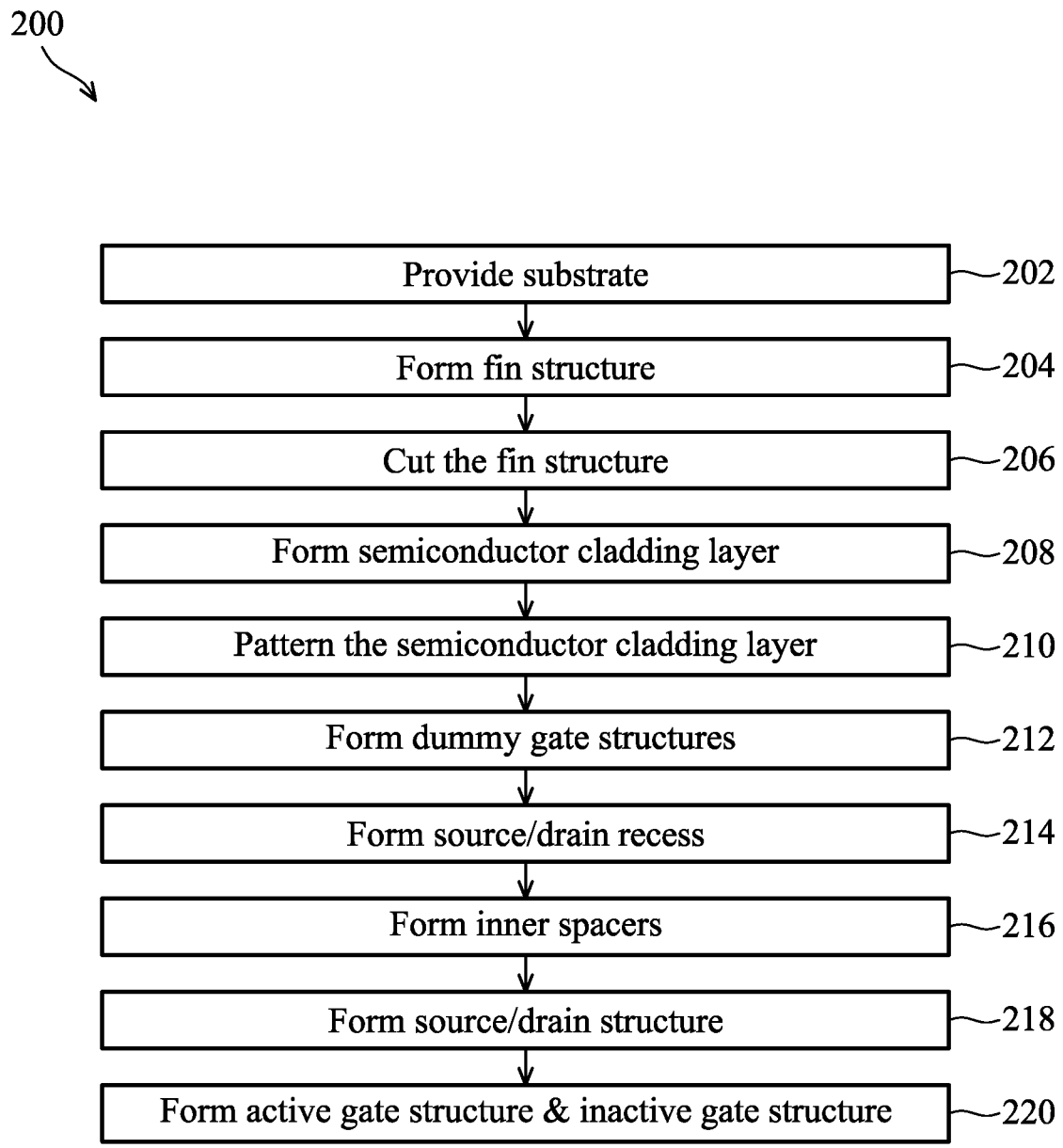
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA transistor (e.g., GAA transistor 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA transistor at various fabrication stages as shown in FIGS. 3, 4, 5, 6, 7, 8, 9, 10, 11, and 12, respectively, which will be discussed in further detail below.

In brief overview, the method 200 starts with operation 202 of providing a substrate. The method 200 continues to operation 204 of forming a fin structure, which includes a number of first semiconductor layers and a number of second semiconductor layers. The method 200 continues to operation 206 of cutting the fin structure. The method 200 continues to operation 208 of forming a semiconductor cladding layer. The method 200 continues to operation 210 of patterning the semiconductor cladding layer. The method 200 continues to operation 212 of forming a number of dummy gate structures. The method 200 continues to operation 214 of forming a source/drain recess between adjacent dummy gate structures. The method 200 continues to operation 216 of forming a source/drain structure in the source/drain recess. The method 200 continues to operation 218 of forming an active (e.g., metal) gate structure and an inactive (e.g., metal) gate structure.

As mentioned above, FIGS. 3-12 each illustrate, in a cross-sectional view, a portion of a GAA transistor 300 at various fabrication stages of the method 200 of FIG. 2. The GAA transistor 300 is similar to the GAA transistor 100 shown in FIG. 1. It should be understood that the GAA transistor 300 may further include a number of other devices (not shown in the following figures) such as inductors, fuses, capacitors, coils, etc., while remaining within the scope of the present disclosure.

Figure 3:
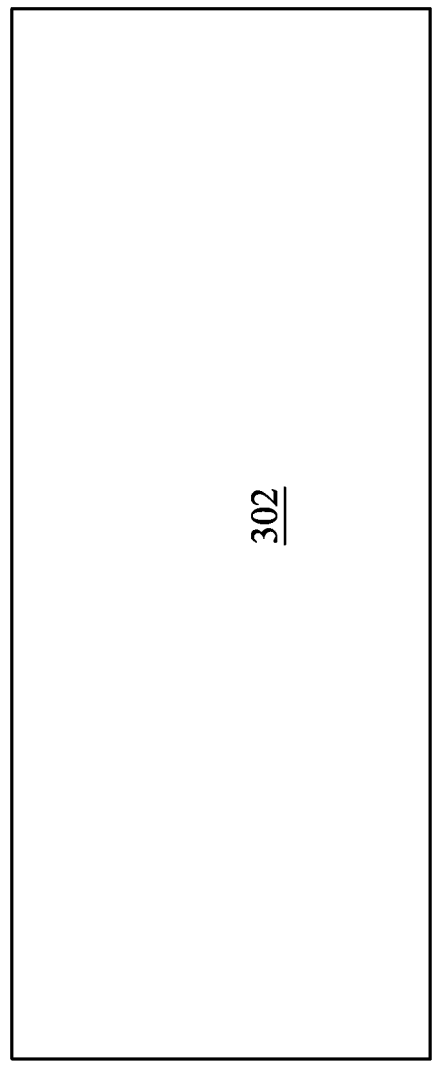
FIGS. 3, 4, 5, 6, 7, 8, 9, 10, 11, and 12 illustrate cross-sectional views of an example GAA FET device (or a portion of the example GAA FET device) during various fabrication stages, made by the method of FIG. 2, in accordance with some embodiments.

Corresponding to operation 202 of FIG. 2, FIG. 3 is a cross-sectional view of the GAA transistor 300 including a semiconductor substrate 302 at one of the various stages of fabrication. The cross-sectional view of FIG. 3 is cut in a direction along the lengthwise direction of a number of channel layers of the GAA transistor 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
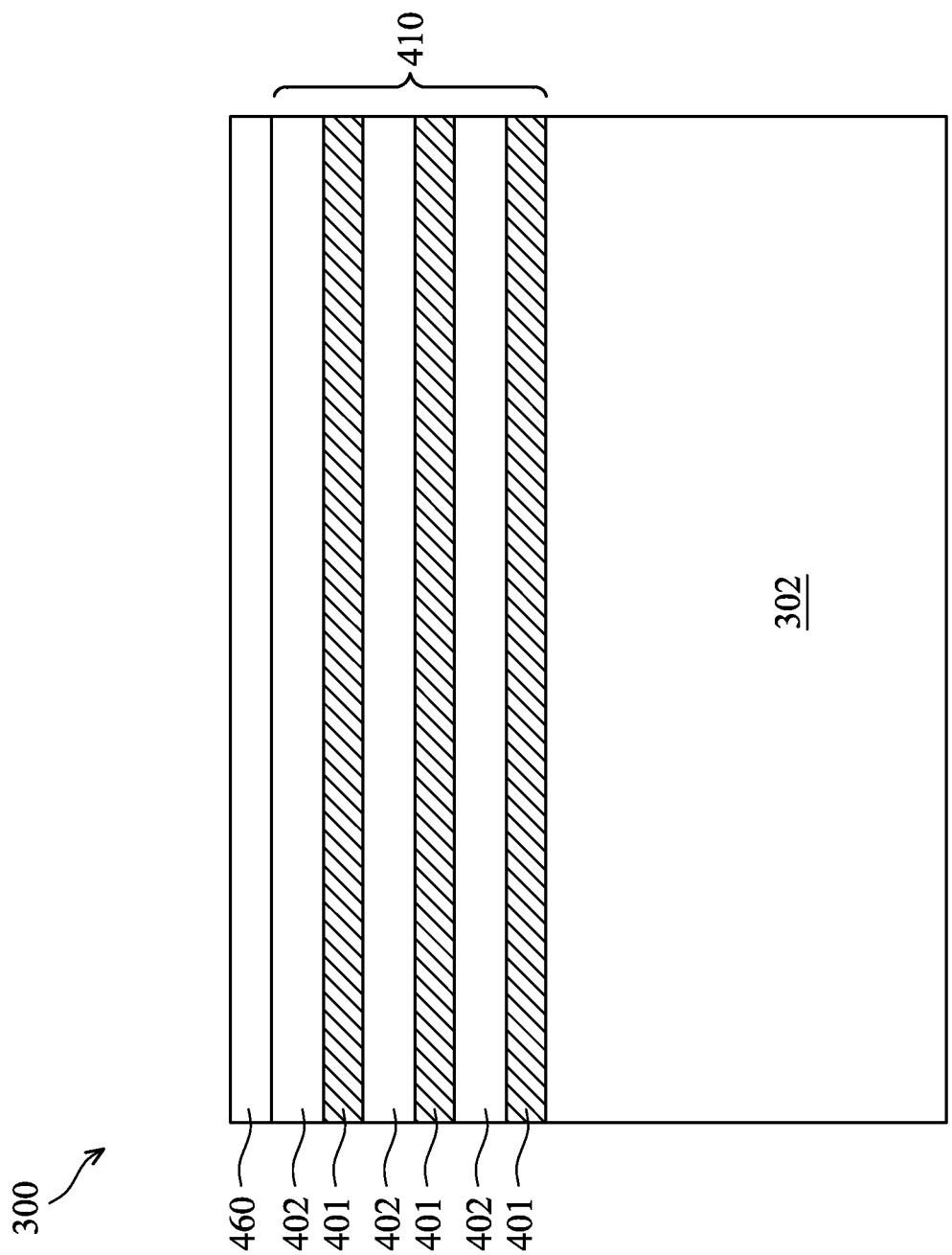

Corresponding to operation 204 of FIG. 2, FIG. 4 is a cross-sectional view of the GAA transistor 300 including a fin structure 410, at one of the various stages of fabrication. The cross-sectional view of FIG. 4 is cut in a direction along the lengthwise direction of a number of channel layers of the GAA transistor 300 (e.g., cross-section A-A indicated in FIG. 1).

To form the fin structure 410, a number of first semiconductor layers 401 and a number of second semiconductor layers 402 are alternatingly disposed on top of one another to form a stack. For example, one of the second semiconductor layers 402 is disposed over one of the first semiconductor layers 401 then another one of the first semiconductor layers 401 is disposed over the second semiconductor layer 402, so on and so forth. The stack may include any number of alternately disposed first and second semiconductor layers 401 and 402. For example in the illustrated embodiments of FIG. 4 (and the following figures), the stack may include 3 first semiconductor layers 401, with 3 second semiconductor layers 402 alternatingly disposed therebetween and with one of the second semiconductor layers 402 being the topmost semiconductor layer. It should be understood that the GAA transistor 300 can include any number of first semiconductor layers and any number of second semiconductor layers, with either one of the first or second semiconductor layers being the topmost semiconductor layer, while remaining within the scope of the present disclosure.

The semiconductor layers 401 and 402 may have respective different thicknesses. Further, the first semiconductor layers 401 may have different thicknesses from one layer to another layer. The second semiconductor layers 402 may have different thicknesses from one layer to another layer. The thickness of each of the semiconductor layers 401 and 402 may range from few nanometers to few tens of nanometers. The first layer of the stack may be thicker than other semiconductor layers 401 and 402. In an embodiment, each of the first semiconductor layers 401 has a thickness ranging from about 5 nanometers (nm) to about 20 nm, and each of the second semiconductor layers 402 has a thickness ranging from about 5 nm to about 20 nm.

The two semiconductor layers 401 and 402 may have different compositions. In various embodiments, the two semiconductor layers 401 and 402 have compositions that provide for different oxidation rates and/or different etch selectivity between the layers. In an embodiment, the first semiconductor layers 401 may each include silicon germanium ($Si_{1-x}Ge_x$), and the second semiconductor layers may each include silicon (Si). In an embodiment, each of the semiconductor layers 402 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 402 (e.g., of silicon).

In various embodiments, the semiconductor layers 402 may be intentionally doped. For example, when the GAA transistor 300 is configured as an n-type transistor (and operates in an enhancement mode), each of the semiconductor layers 402 may be silicon that is doped with a p-type dopant such as boron (B), aluminum (Al), indium (In), and gallium (Ga); and when the GAA transistor 300 is configured as a p-type transistor (and operates in an enhancement mode), each of the semiconductor layers 402 may be silicon that is doped with an n-type dopant such as phosphorus (P), arsenic (As), antimony (Sb). In another example, when the GAA transistor 300 is configured as an n-type transistor (and operates in a depletion mode), each of the semiconductor layers 402 may be silicon that is doped with an n-type dopant instead; and when the GAA transistor 300 is configured as a p-type transistor (and operates in a depletion mode), each of the semiconductor layers 402 may be silicon that is doped with a p-type dopant instead.

In some embodiments, each of the semiconductor layers 401 is $Si_{1-x}Ge_x$ that includes less than 50% (x<0.5) Ge in molar ratio. For example, Ge may comprise about 15% to 35% of the semiconductor layers 401 of $Si_{1-x}Ge_x$ in molar ratio. Furthermore, the first semiconductor layers 401 may include different compositions among them, and the second semiconductor layers 402 may include different compositions among them. Either of the semiconductor layers 401 and 402 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 401 and 402 may be chosen based on providing differing oxidation rates and/or etch selectivity.

The semiconductor layers 401 and 402 can be epitaxially grown from the semiconductor substrate 302. For example, each of the semiconductor layers 401 and 402 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 401 and 402 having the same crystal orientation with the semiconductor substrate 302.

Upon growing the semiconductor layers 401 and 402 on the semiconductor substrate 302 (as a stack), the stack may be patterned to form the fin structure 410. The fin structures 410 elongates along a lateral direction parallel with the plane of FIG. 4, and includes a stack of patterned semiconductor layers 401 and 402 interleaved with each other. The fin structure 410 can be formed by patterning the stack of semiconductor layers 401 and 402, and the semiconductor substrate 302 using, for example, photolithography and etching techniques.

For example, a mask layer (which can include multiple layers such as, for example, an optional pad oxide layer and an overlying hardmask layer, e.g., 460) is formed over the topmost semiconductor layer of the stack (e.g., 402 in FIG. 4). The pad oxide layer may be a thin film comprising silicon oxide formed, for example, using a thermal oxidation process. The pad oxide layer may act as an adhesion layer between the topmost semiconductor layer 402 and the hardmask layer 460. In some embodiments, the hardmask layer 460 may include silicon nitride, silicon oxynitride, silicon carbonitride, the like, or combinations thereof. In some other embodiments, the hardmask layer 460 may include a material similar as a material of the semiconductor layer 401 or 402 such as, for example, $Si_{1-y}Ge_y$, Si, etc., in which the molar ratio (y) may be different from or similar to the molar ratio (x) of the semiconductor layers 401. The hardmask layer 460 may be formed over the stack (i.e., before patterning the stack) using low-pressure chemical vapor deposition (LPCVD) or plasma enhanced chemical vapor deposition (PECVD), for example.

The mask layer (the optional pad oxide layer and hardmask layer 460) may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 401-402 and the substrate 302 to form the fin structure 410, thereby defining trenches (or openings) between adjacent fin structures. When multiple fin structures are formed (which are not shown in the figures of the present disclosure), such a trench may be disposed between any adjacent ones of the fin structures. In some embodiments, the fin structure 410 is formed by etching the semiconductor layers 401-402 and substrate 302 to form trenches using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the respective fin structures.

According to various embodiments of the present disclosure, the semiconductor layers 402 in the fin structure 410 may collectively function as the conductive channel of a completed transistor. Accordingly, the semiconductor layers 402 may sometimes be referred to as channel layers. The semiconductor layers 401 in the fin structure 410 may be later replaced with a portion of an active gate structure that is configured to wrap around the corresponding channel layers. Accordingly, the semiconductor layers 401 may sometimes be referred to as sacrificial layers.

Figure 5:
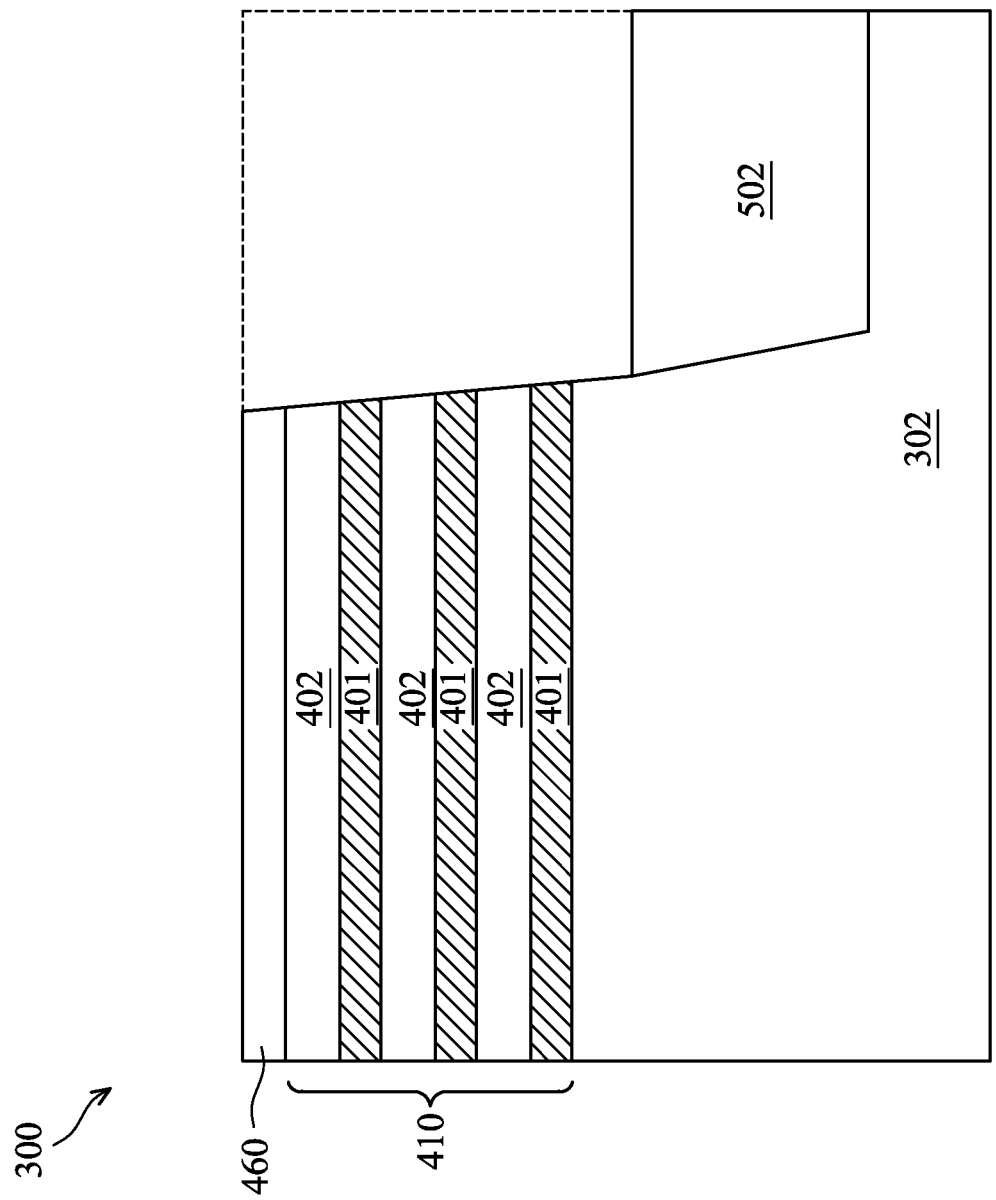

Corresponding to operation 206 of FIG. 2, FIG. 5 is a cross-sectional view of the GAA transistor 300 in which the fin structure 410 is cut or otherwise discontinued, at one of the various stages of fabrication. The cross-sectional view of FIG. 5 is cut in a direction along the lengthwise direction of a number of channel layers of the GAA transistor 300 (e.g., cross-section A-A indicated in FIG. 1).

An etching process may be performed to remove a portion of the fin structure 410, which is enclosed by a dotted line in FIG. 5, and a portion of the substrate 302, which may be partially filled up with an isolation structure 502. Although in the illustrated example of FIG. 5 (and the following figures), the fin structure 410 is cut by removing one portion, it should be understood that any number of portions of the fin structure 410 along its lengthwise direction can be removed, while remaining within the scope of the present disclosure. Such a fin structure 410, with one or more its portions removed, may sometimes be referred to as "cut fin structure 410."

For example, the etching process can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Upon forming the cut fin structure 410 (i.e., forming a trench along the lengthwise direction of the fin structure, with the trenches present between adjacent fin structures or next to the fin structure 410), those trenches may be partially filled with the isolation structure 502. To form the isolation structure 502, an insulation material may be universally deposited over the workpiece, which includes the fin structure 410. For example, the insulation material may overlay the fin structure 410 by extending along its respective sidewalls (that the lengthwise direction and the directions perpendicular to the lengthwise direction) and overlaying their respective top surfaces.

In some embodiments, the insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of the hardmask layer 460. The hardmask layer 460 may also be removed by the planarization process, in some embodiments.

Next, the insulation material is recessed to form the isolation structure 502, as shown in FIG. 5. The isolation structure 502 is sometimes referred to as a shallow trench isolation (STI) 502. The isolation structure 502 is recessed such that the fin structure 410 can protrude from between neighboring portions of the isolation structure 502. The top surface of the isolation structure (STI) 502 may have a flat surface (as illustrated), a convex surface, a concave surface (such as dishing), or combinations thereof. The top surface of the isolation structure 502 may be formed flat, convex, and/or concave by an appropriate etch. The isolation structure 502 may be recessed using an acceptable etching process, such as one that is selective to the insulation material of the isolation structure 502. For example, a dry etch or a wet etch using dilute hydrofluoric (DHF) acid may be performed to form the isolation structure 502.

Figure 6:
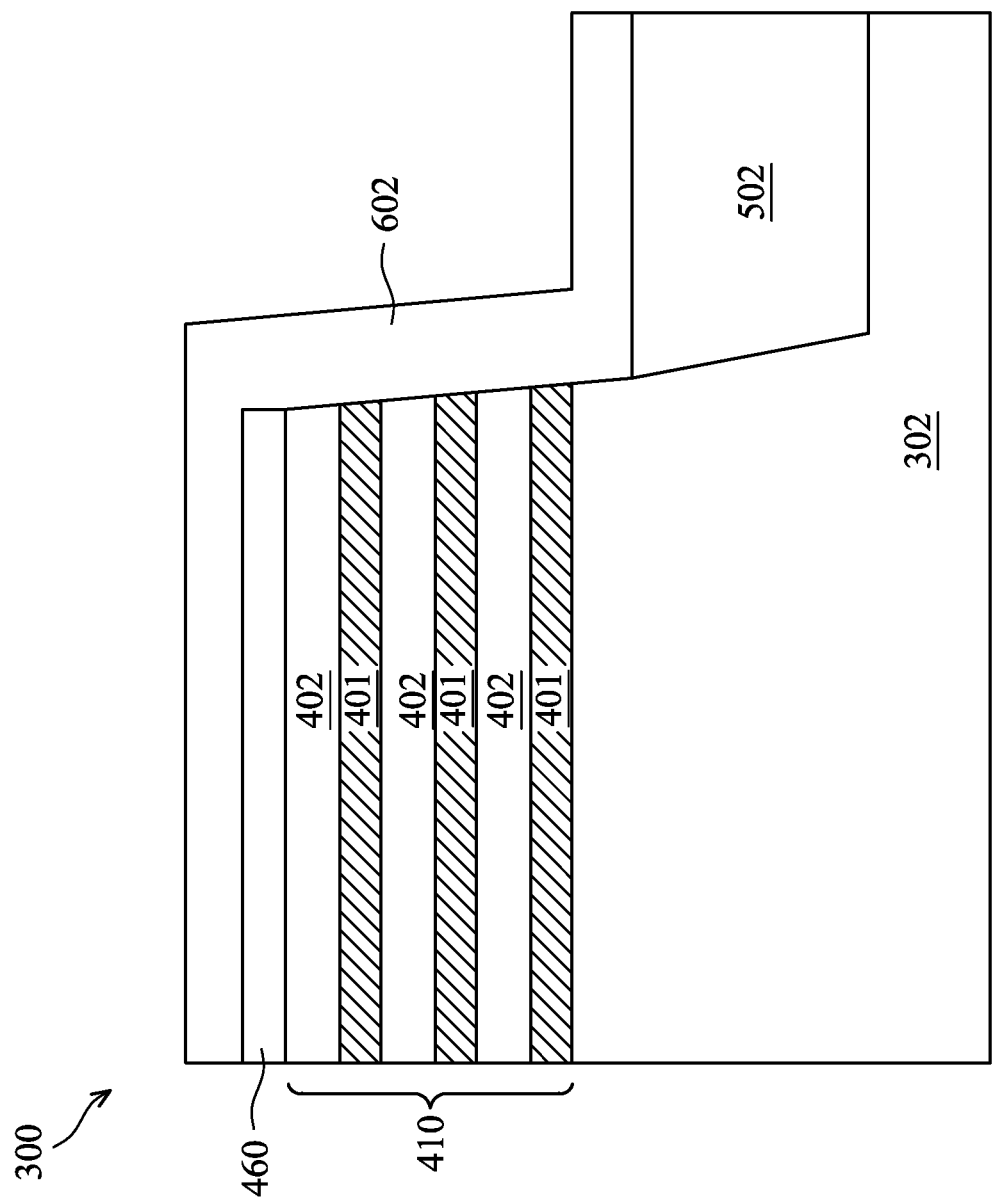

Corresponding to operation 208 of FIG. 2, FIG. 6 is a cross-sectional view of the GAA transistor 300 including a semiconductor cladding layer 602, at one of the various stages of fabrication. The cross-sectional view of FIG. 6 is cut in a direction along the lengthwise direction of a number of channel layers of the GAA transistor 300 (e.g., cross-section A-A indicated in FIG. 1).

As shown, the semiconductor cladding layer 602 (e.g., conformally) extends along a sidewall (or edge) of the cut fin structure 410, overlays the top surface of the topmost semiconductor layer 402, or the hardmask layer 460 (if still present), and overlays the top surface of the STI 502. In various embodiments, the semiconductor cladding layer 602 include a material similar as a material of the semiconductor layer 401 or 402 such as, for example, $Si_{1-z}Ge_z$, Si, etc., in which the molar ratio (z) may be different from or similar to the molar ratio (x) of the semiconductor layers 401. For example, the molar ratio (z) of the semiconductor cladding layer 602 may be lower than the molar ratio (x) of the semiconductor layers 401, which can limiting an etching amount on the semiconductor cladding layer 602 when forming inner spacers on the ends of the semiconductor layers 401. The semiconductor cladding layer 602 may be grown by a molecular beam epitaxy (MBE) process, a chemical vapor deposition (CVD) process such as a metal organic CVD (MOCVD) process, and/or other suitable growth processes.

Figure 7:
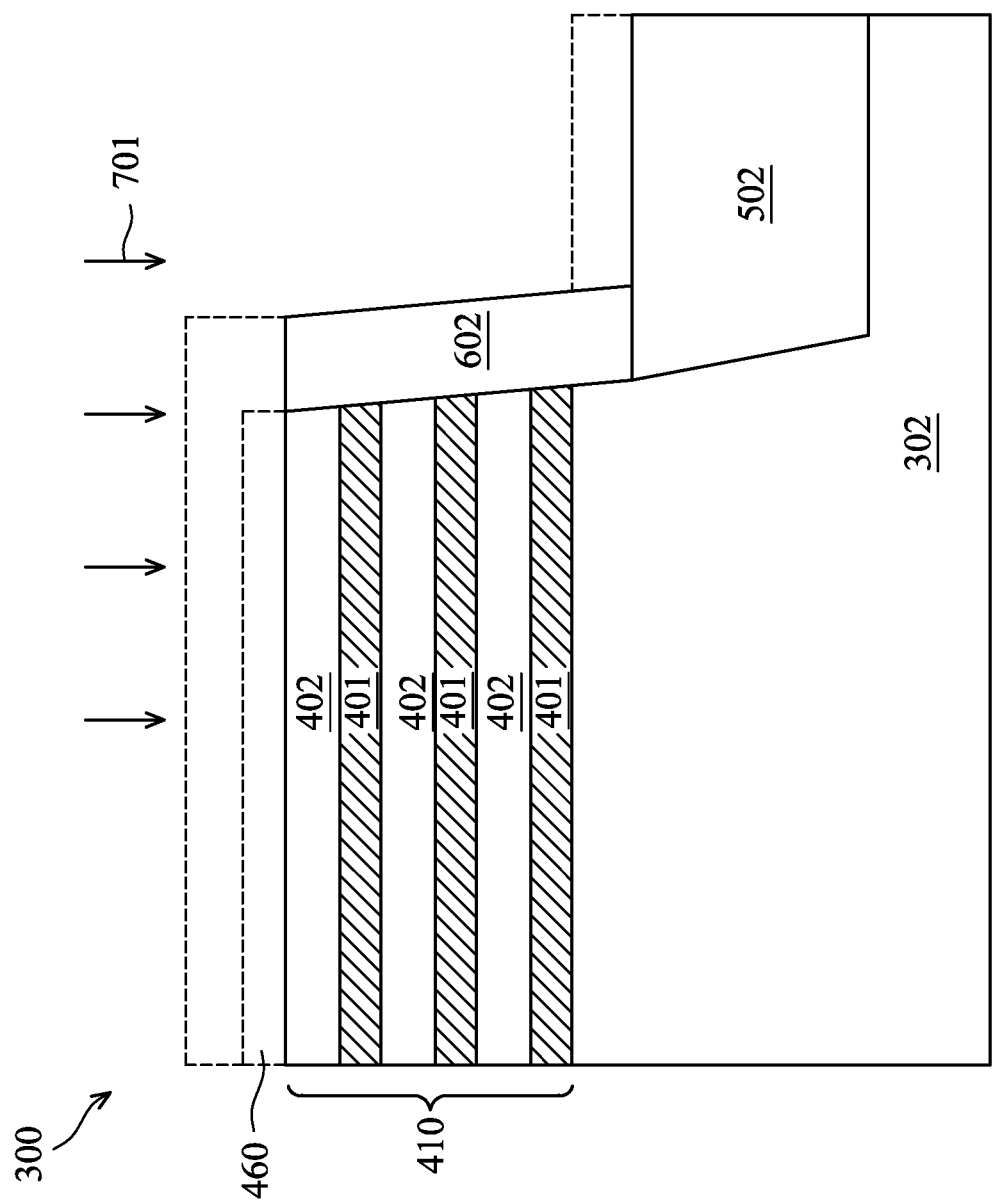

Corresponding to operation 210 of FIG. 2, FIG. 7 is a cross-sectional view of the GAA transistor 300 in which the semiconductor cladding layer 602 is etched, at one of the various stages of fabrication. The cross-sectional view of FIG. 7 is cut in a direction along the lengthwise direction of a number of channel layers of the GAA transistor 300 (e.g., cross-section A-A indicated in FIG. 1).

An etching process (e.g., 701) may be performed to remove a portion of the semiconductor cladding layer 602, which is enclosed by a dotted line in FIG. 7. The etching process 701 may be anisotropic (e.g., vertically directional). As such, upon performing the etching process 701, one or more laterally extending portions of the semiconductor cladding layer 602 can be removed. For example in FIG. 7, at least a portion of the semiconductor cladding layer 602 that is disposed above the hardmask layer 460 (if still present) or the topmost semiconductor layer 402 and a portion of the semiconductor cladding layer 602 that is disposed above the STI 502 may be removed by the etching process 701. Consequently, remaining is a portion of the semiconductor cladding layer 602 that extends along the edge/sidewall of the cut fin structure 410, as shown in FIG. 7. Following the etching process 701, a CMP process may be performed to remove the hardmask layer (if still present) 460 and a portion of the semiconductor cladding layer 460 laterally next to the hardmask layer 460, in some embodiments. As such, the top surface of the topmost semiconductor layer 402 can be exposed, which rendering a coplanar surface shared at least by the topmost semiconductor layer 402 and the semiconductor cladding layer 602.

For example, the etching process 701 can include a plasma etching process. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the plasma etching process, the gas sources and/or the passivation gases can be diluted with gases such as argon (Ar), helium (He), neon (Ne), and other suitable dilutive gases and combinations thereof.

Figure 8:
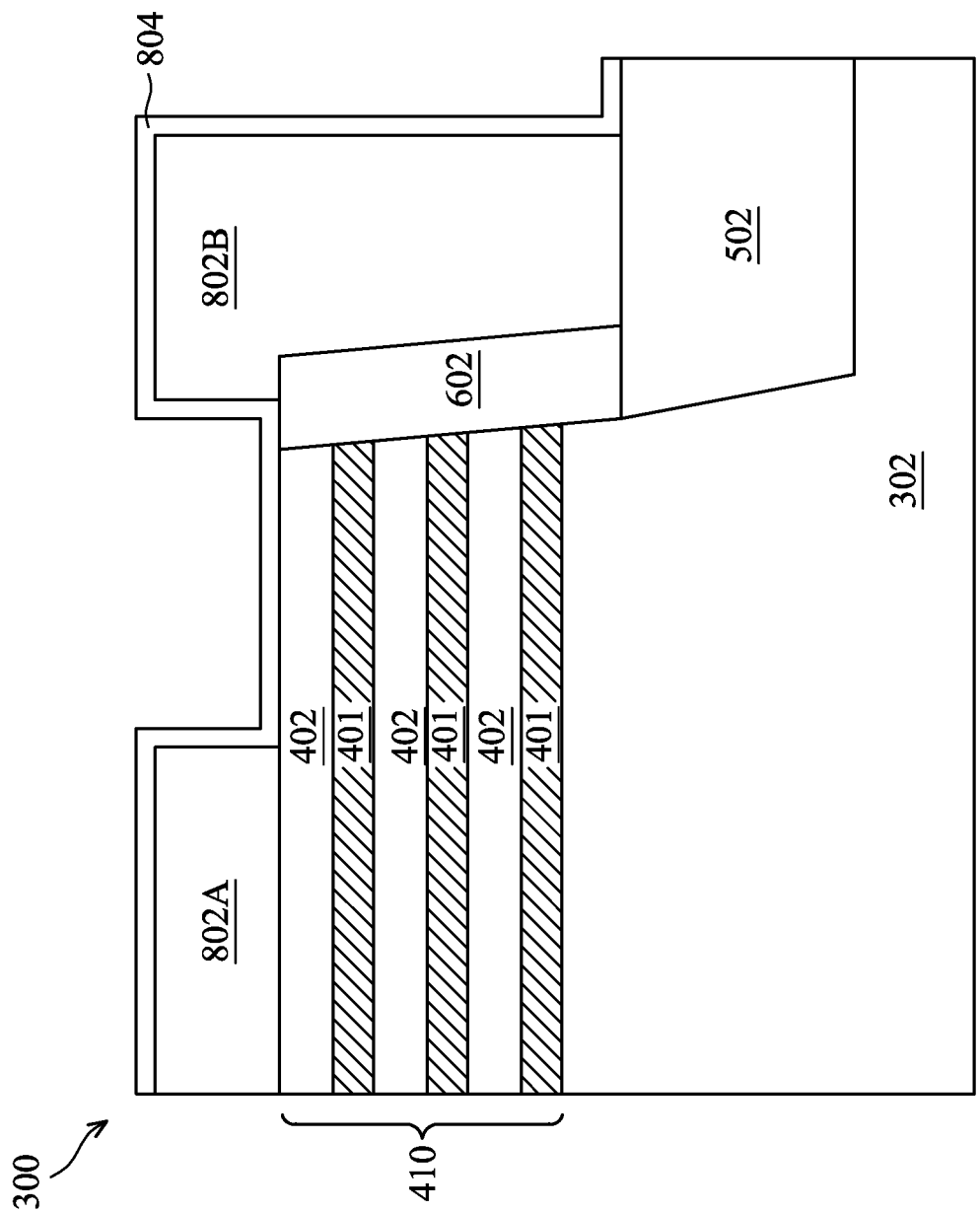

Corresponding to operation 212 of FIG. 2, FIG. 8 is a cross-sectional view of the GAA transistor 300 including dummy gate structures 802A and 802B, at one of the various stages of fabrication. The cross-sectional view of FIG. 8 is cut in a direction along the lengthwise direction of a number of channel layers of the GAA transistor 300 (e.g., cross-section A-A indicated in FIG. 1).

The dummy gate structures 802A-B may have a lengthwise direction perpendicular to the lengthwise direction of the fin structure 410. As such, the dummy gate structures 802A-B may be formed to each overlay (e.g., straddle) a portion of the fin structure 410. For example in FIG. 8, the dummy gate structures 802A and 802B may straddle respective portions of the fin structure 410. Specifically, the dummy gate structure 802A straddles the portion of the fin structure 410 that is not cut, and the dummy gate structure 802B straddles the portion of the fin structure 410 that is cut. As such, the dummy gate structure 802A contacts the top surface of the fin structure 410, and extends along portions of the sidewalls of the fin structure 410 (e.g., the sidewalls facing the direction perpendicular to the lengthwise direction of the fin structure). And, the dummy gate structure 802B contacts the top surface of the semiconductor cladding layer 602, and extends along portions of the sidewalls of the semiconductor cladding layer 602 (e.g., the sidewalls facing the direction perpendicular to the lengthwise direction of the fin structure, and the sidewall facing the lengthwise direction of the fin structure). In some embodiments, the dummy gate structures 802A and 802B may sometimes be referred to as non-PODE and PODE, respectively.

The dummy gate structures 802A-B may each include a dummy gate dielectric and a dummy gate, which are not shown separately for purpose of clarity. To form the dummy gate structures 802A-B, a dielectric layer may be formed over the fin structure 410 (and the semiconductor cladding layer 602). The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structures 802A and 802B, respectively.

Upon forming the dummy gate structures 802A-B, a gate spacer 804 may be formed over a top surface of each of the dummy gate structures 802A and 802B, along opposing sidewalls of each of the dummy gate structures 802A and 802B, and over a portion of the fin structure 410/semiconductor cladding layer 602/STI 502 that is not overlaid by the dummy gate structures 802A-B, as shown in FIG. 8. The gate spacer 804 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 804. The shapes and formation methods of the gate spacer 804, as illustrated in FIG. 8, are merely non-limiting examples, and other shapes and formation methods are possible. These and other variations are fully intended to be included within the scope of the present disclosure.

Figure 9:
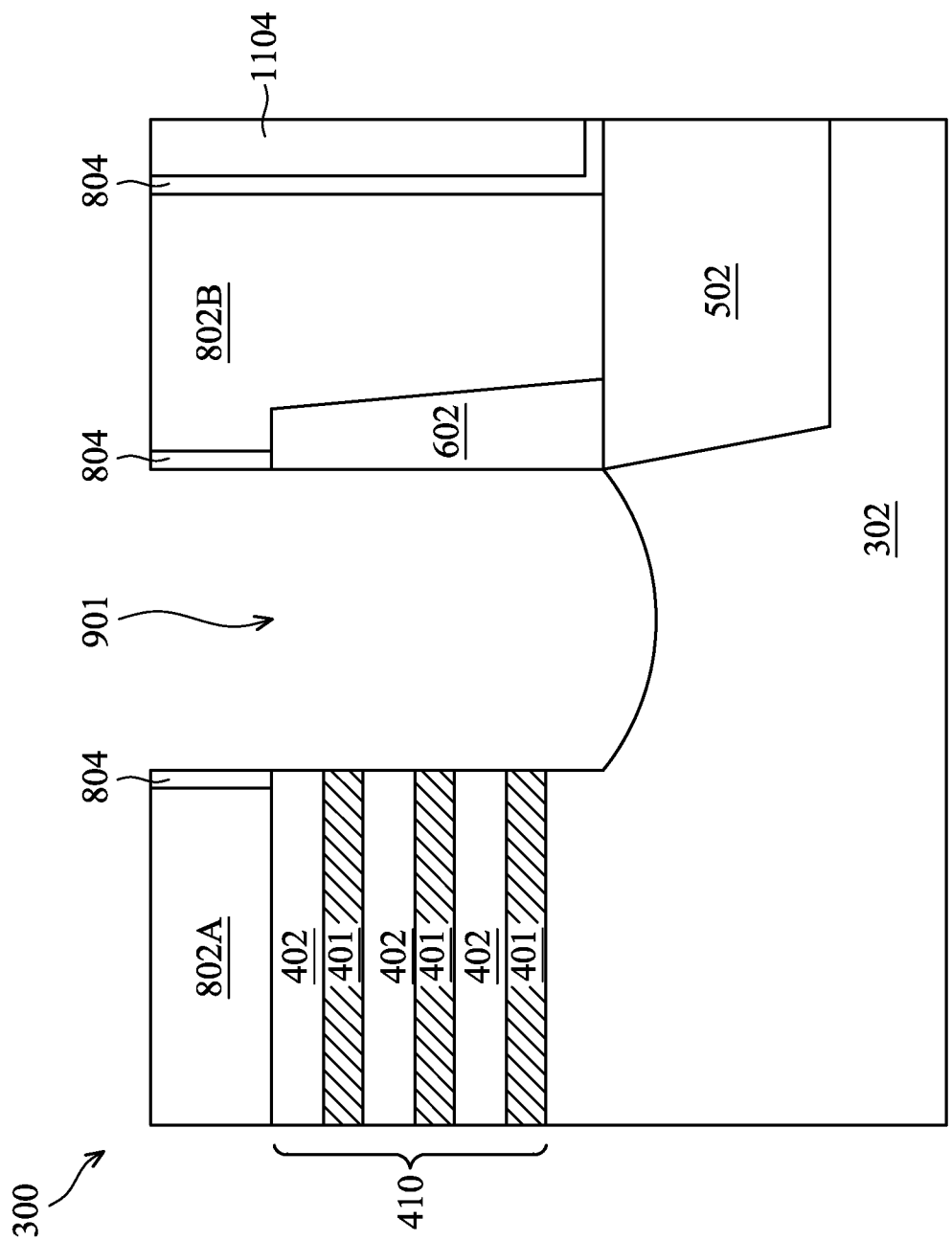

Corresponding to operation 214 of FIG. 2, FIG. 9 is a cross-sectional view of the GAA transistor 300 in which one or more portions of the fin structure 410 that are not overlaid by the dummy gate structures 802A-B are removed, at one of the various stages of fabrication. The cross-sectional view of FIG. 9 is cut in a direction along the lengthwise direction of a number of channel layers of the GAA transistor 300 (e.g., cross-section A-A indicated in FIG. 1).

In various embodiments, lateral portions of the gate spacer 804 (e.g., the lateral portions over the dummy gate structures 802A-B, and between the dummy gate structures 802A-B) may be first removed. Next, the dummy gate structures 802A-B (together with vertical portions of the gate spacer 804) can serve as a mask to recess (e.g., etch) the non-overlaid portions of the fin structure 410, which results in the remaining fin structure 410 having respective remaining portions of the semiconductor layers 401 and 402 alternately stacked on top of one another. As a result, a source/drain recess (or trench) 901 can be formed on opposite sides of the remaining fin structure 410, where one of the source/drain recesses is shown in the example of FIG. 9. In some embodiments, the source/drain recess 901 can have two asymmetric (inner) sidewalls. One sidewall is defined by the respective sidewalls of the remaining semiconductor layers 401 and 402 and substrate 302, and the other sidewall is defined by a sidewall of the semiconductor cladding layer 602. To have such asymmetric sidewalls, a position of the dummy gate structure 802B may be defined to cause the recessing step (that forms the source/drain recess 901) also etches a portion of the semiconductor cladding layer 602, in accordance with various embodiments.

The recessing step to form the source/drain recess 901 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates.

Figure 10:
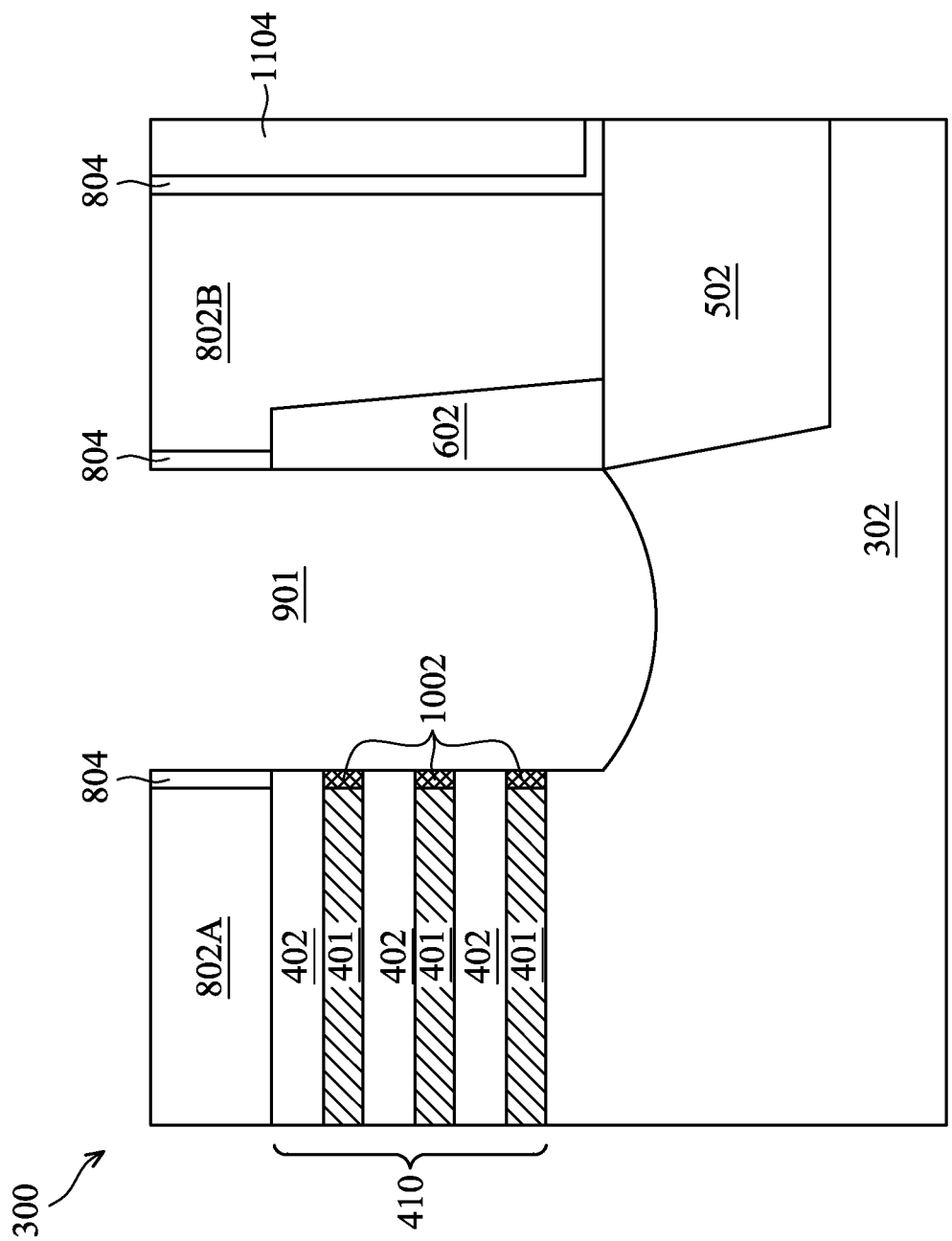

Corresponding to operation 216 of FIG. 2, FIG. 10 is a cross-sectional view of the GAA transistor 300 including a number of inner spacers 1002, at one of the various stages of fabrication. The cross-sectional view of FIG. 10 is cut in a direction along the lengthwise direction of a number of channel layers of the GAA transistor 300 (e.g., cross-section A-A indicated in FIG. 1).

To form the inner spacers 1002, end portions of the semiconductor layers 401 can be removed (e.g., etched) using a "pull-back" process to pull the semiconductor layers 401 of the fin structure 410 back by a pull-back distance. In an example where the semiconductor layers 402 include Si, and the semiconductor layers 401 include SiGe, the pull-back process may include a hydrogen chloride (HCl) gas isotropic etch process, which etches SiGe without attacking Si. As such, the Si layers 402 may remain intact during this process. Consequently, a pair of recesses can be formed on the ends of each of the semiconductor layers 401, with respect to the neighboring semiconductor layers 402. Next, such a pair of recesses along the ends of each semiconductor layer 401 can be filled with a dielectric material to form the inner spacers 1002, as shown in FIG. 10 (where one of the pair is shown). The dielectric material for the inner spacers may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 11:
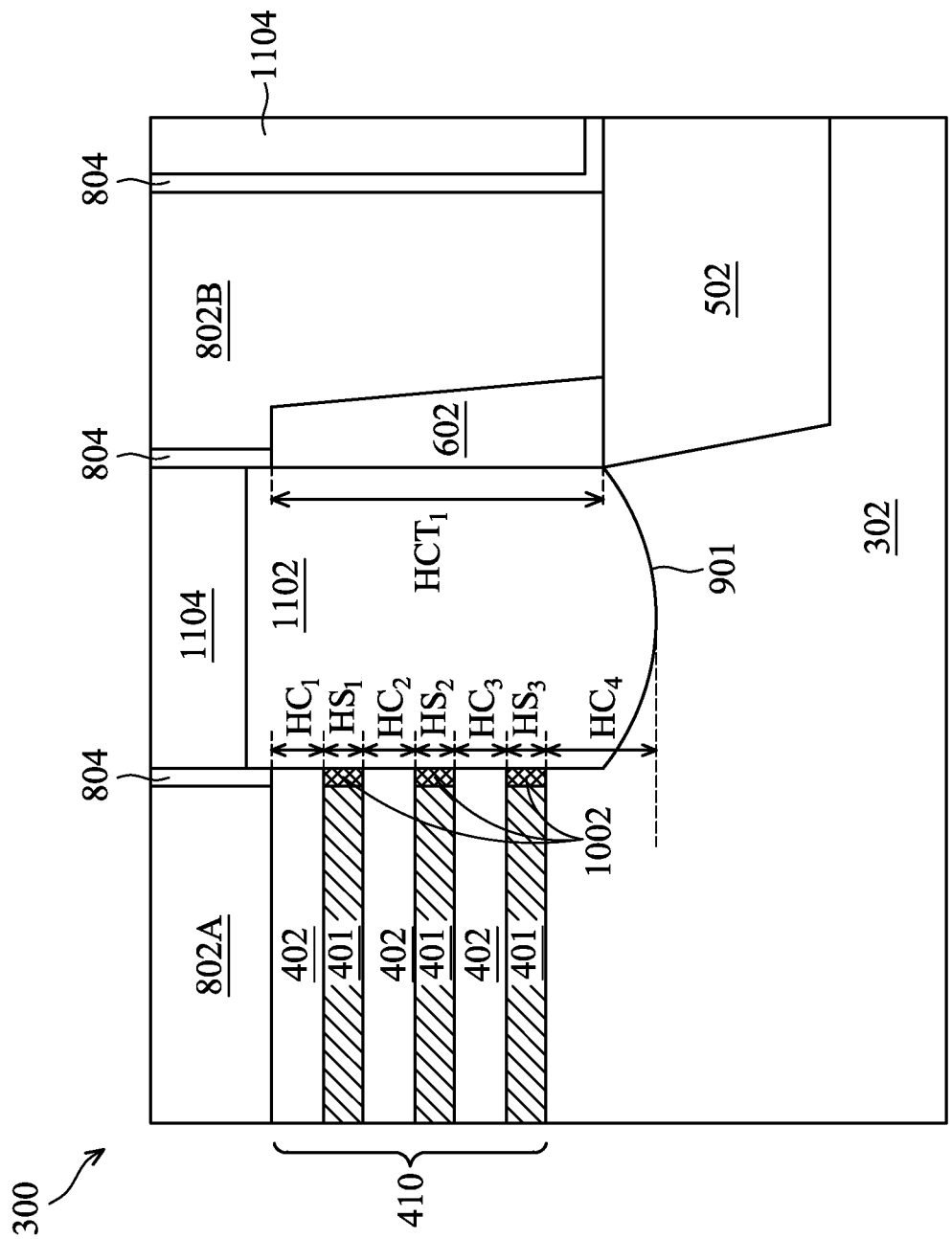

Corresponding to operation 218 of FIG. 2, FIG. 11 is a cross-sectional view of the GAA transistor 300 including a source/drain structure 1102, at one of the various stages of fabrication. The cross-sectional view of FIG. 11 is cut in a direction along the lengthwise direction of a number of channel layers of the GAA transistor 300 (e.g., cross-section A-A indicated in FIG. 1).

The source/drain structure 1102 is formed by epitaxially growing a semiconductor material in the source/drain recess 901, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof. By having the asymmetric sidewalls as disclosed herein, a (e.g., semiconductor) contact area that source/drain recess 901 can offer to epitaxially grow a source/drain structure therein is significantly increased, when compared to the source/drain recess in the existing technologies. For example, in the existing technologies, both sidewalls of a source/drain recess have the semiconductor contact area available for epitaxially growing a source/drain structure through the exposed sidewalls of the semiconductor layer 402. As disclosed herein, the semiconductor contact area available for epitaxially growing a source/drain structure is increased through providing one of the sidewalls of the source/drain recess 901 as a continuously extending sidewall of the semiconductor cladding layer 602.

In some embodiments, the available contact area along each of the asymmetric sidewalls can be characterized with a ratio. Specifically, a ratio along the sidewall constituted by the channel layers 402 and the substrate 302 (hereinafter "ratio of channel in active site (RCA)") can be defined as $$\frac{HC1 + HC2 + \cdots + HCn}{(HC1 + HC2 + \cdots + HCn) + (HS1 + HS2 + \cdots + HSm)}.$$

HC1 through HCn represent the respective thicknesses/heights of a number of semiconductor layers (which can each be the channel layer 402 or substrate 302), and HS1 through HSm represent the respective thicknesses/heights of a number of non-semiconductor layers (which can each be the inner spacer 1002). Similarly, a ratio along the sidewall constituted by the semiconductor cladding layer 602 (hereinafter "ratio of channel in inactive site (RCI)") can be defined as $$\frac{HCI1 + HCI2 + \cdots + HCIn}{(HCI1 + HCI2 + \cdots + HCIn) + (HSI1 + HSI2 + \cdots + HSIm)}.$$

HCI1 through HCIn represent respective thicknesses/heights of a number of semiconductor layers (which can be the semiconductor cladding layer 602), and HS1 through HSm represent respective thicknesses/heights of a number of non-semiconductor layers (which is absent in the illustrated example of FIG. 11). The subscripts "n" and "m" represent the number of such semiconductor layers and the number of such non-semiconductor layers, respectively, wherein n=m, or n=m+1. In the example of FIG. 11, RCI may be equal to about 100%, while RCA may range between about 25% and about 75%. In accordance with various embodiments, with such asymmetric sidewalls in a source/drain recess, the ratio, RCA, may be less than the ratio, RCI.

In some other embodiments, the semiconductor cladding layer 602 may be replaced with another stack (fin structure) having alternately stacked semiconductor layers similar as the semiconductor layers 401 and 402, which is formed, for example, during operation 204 (FIG. 2). In comparison with the fin structure 410, such a fin structure can have a different number of channel layers 402 and/or thinker (higher) channel layers 402. For example, with such an alternative fin structure opposite to the fin structure 410, a number of inner spacers may be formed along a sidewall of this fin structure concurrently with forming the inner spacers 1002. As such, although RCI may be less than 100% (because of the terms HS1 through HSm being nonzero), RCI can still be greater than RCA.

Although in the illustrated example of FIG. 11, one source/drain structure (e.g., 1102) is shown, it should be understood that a pair of source/drain structures can be formed on opposite sides of the fin structure 410. Each of the source/drain structures couples to the semiconductor layers 402 of the fin structure 410, and separate from the semiconductor layers 401 of the fin structure 410 with the inner spacers 1002 disposed therebetween. Further, the source/drain structure 1102 is separated (e.g., electrically isolated) from each of the dummy gate structures 802A and 802B, with (at least a lower portion of) the gate spacer 804.

Upon forming the source/drain structure 1102, an interlayer dielectric (ILD) 1104 may be formed to overlay the source/drain structure 1102. The ILD 1104 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structures 802A and 802B, in some embodiments.

Figure 12:
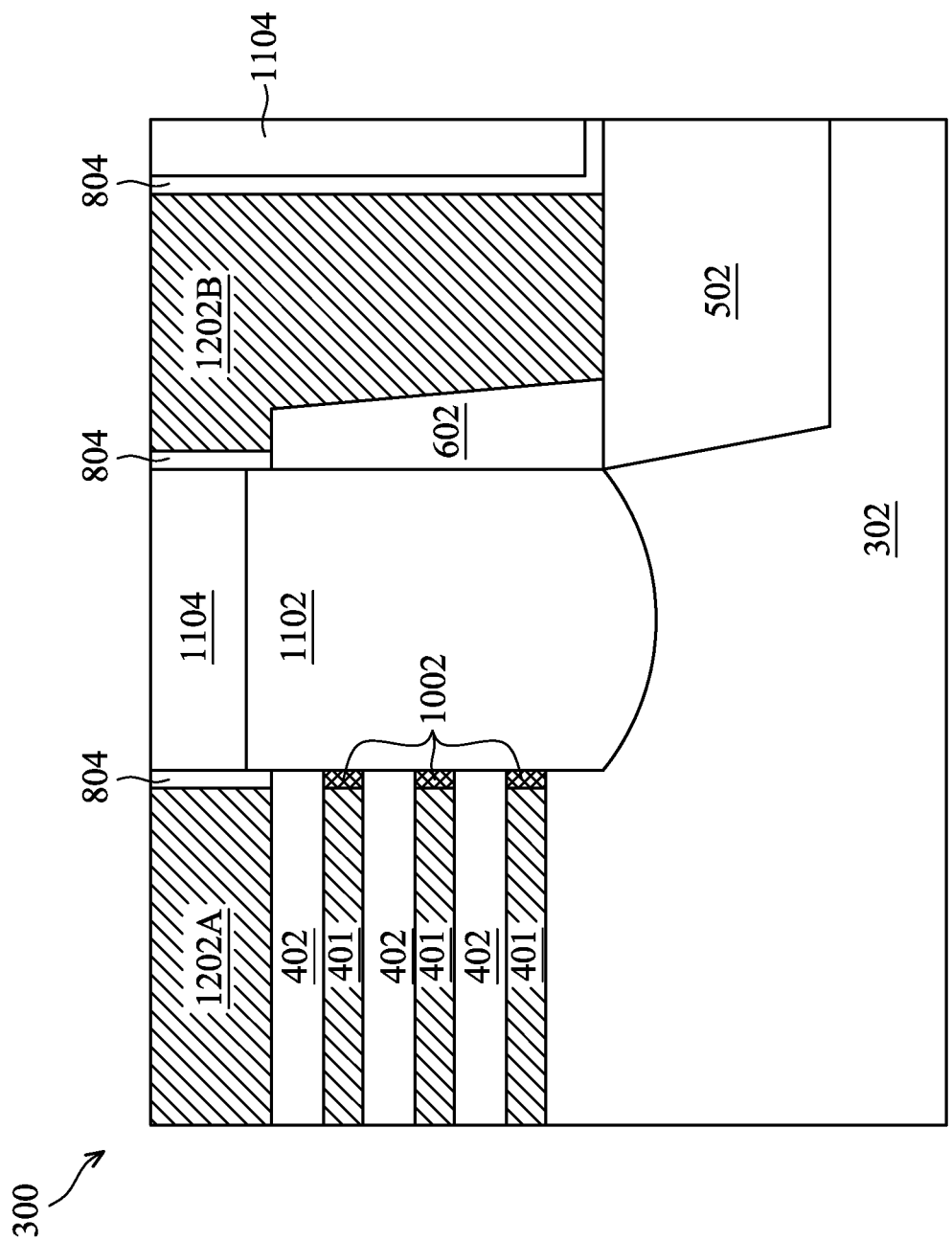

Corresponding to operation 220 of FIG. 2, FIG. 12 is a cross-sectional view of the GAA transistor 300 including an active (e.g., metal) gate structure 1202A and an inactive (e.g., metal) gate structure 1202B, at one of the various stages of fabrication. The cross-sectional view of FIG. 12 is cut in a direction along the lengthwise direction of a number of channel layers of the GAA transistor 300 (e.g., cross-section A-A indicated in FIG. 1).

Subsequently to forming the ILD 1104, the dummy gate structures 802A and 802B and the (remaining) sacrificial layers 401 may be removed. In various embodiments, the dummy gate structures 802A-B may be removed by applying a first selective etching process, and the sacrificial layers 401 may be removed by applying a second selective etching process (e.g., a hydrochloric acid (HCl)), while the channel layers 402 remain substantially intact during both of the etching processes. After the removal of the dummy gate structure 802A, a first gate trench, exposing respective sidewalls of each of the channel layers 402 (facing the direction in or out of the plane of FIG. 11). Further, the top surface of the topmost semiconductor layer 402 can be exposed. After the removal of the dummy gate structure 802B, a second gate trench, exposing sidewalls and the top surface of the semiconductor cladding layer 602, may be formed. Specifically, the exposed sidewalls of the semiconductor cladding layer 602 include the two sidewalls facing the direction in or out of the plane of FIG. 11 and one sidewall facing a direction perpendicular to the direction in or out of the plane of FIG. 11. After the removal of the sacrificial layers 401, the first gate trench can be further extended by exposing respective bottom surface and/or top surface of each of the channel layers 402. Consequently, a full circumference of each of the channel layers 402 can be exposed. Next, the active gate structure 1202A is formed to wrap around each of the channel layers 402 of the fin (or stack) structure 410; and the inactive gate structure 1202B is formed to straddle the semiconductor cladding layer 602 (e.g., overlaying its top surface and extending along its sidewalls). Further, the inactive gate structure 1202B can be in contact with a portion of the STI 502, in some embodiments.

The gate structures 1202A and 1202B each include a gate dielectric and a gate metal, in some embodiments. The gate dielectric of the active gate structure 1202A can wrap around each of the channel layers 402, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 402.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

FIGS. 13, 14, 15, and 16 respectively illustrate cross-sectional views of the GAA transistor 300, in various other embodiments. The cross-sectional views of FIGS. 13-16 are each cut in a direction along the lengthwise direction of a number of channel layers of the GAA transistor 300 (e.g., cross-section A-A indicated in FIG. 1).

Figure 13:
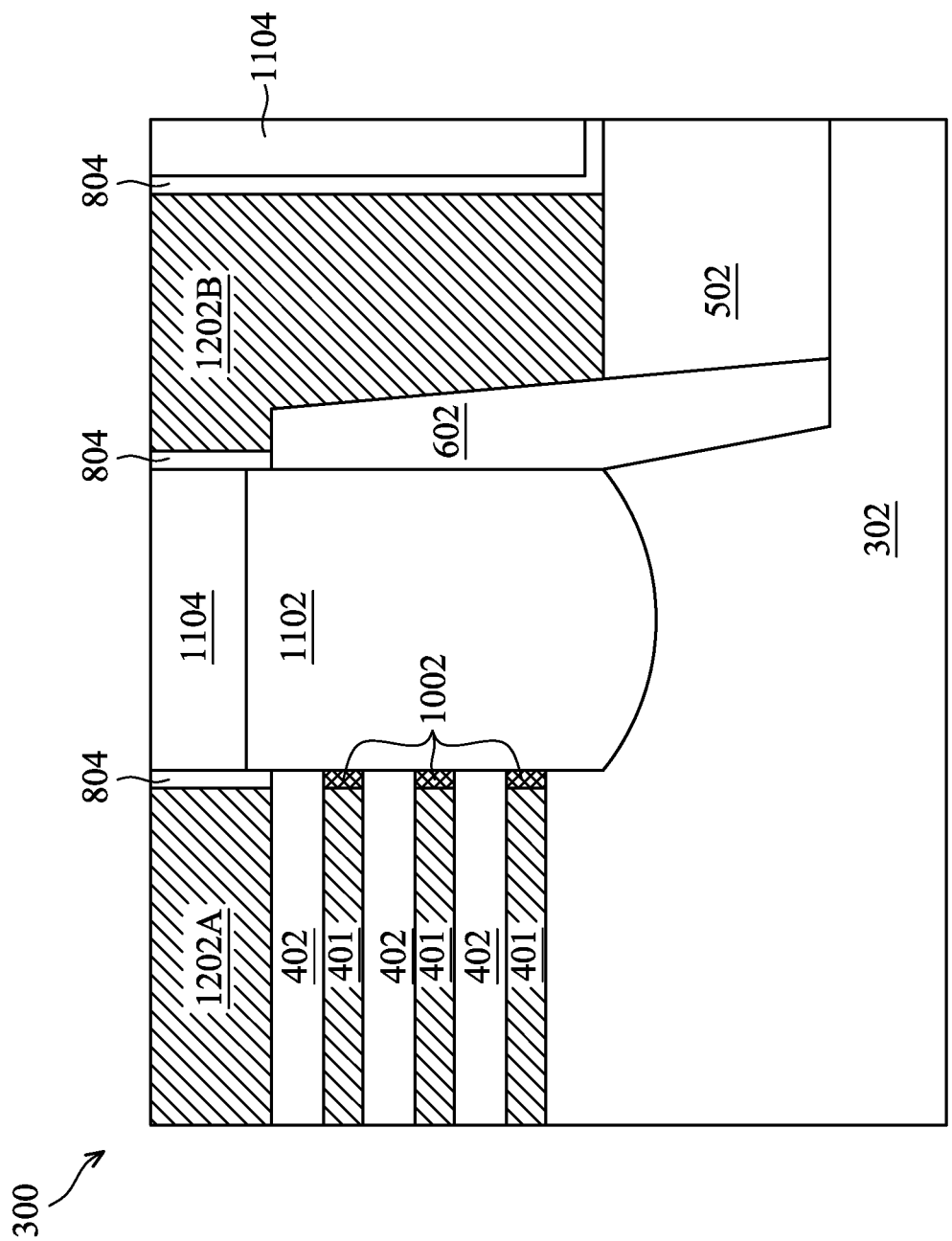
FIGS. 13, 14, 15, and 16 illustrate cross-sectional views of the example GAA FET device (or a portion of the example GAA FET device), made by the method of FIG. 2, in accordance with some other embodiments.

Referring first to FIG. 13, the semiconductor cladding layer 602 can further extend into the STI 502 and may contact the substrate 302. As such, with a portion of the sidewall (of the semiconductor cladding layer 602) contacts the inactive metal gate structure 1202B, a remaining portion of the sidewall can contact a sidewall of the STI 502. In such embodiments, the semiconductor cladding layer 602 may be formed following the formation of the STI 502. For example, prior to forming the fin structure 410, there may be one or more other stacks, each of which includes a single semiconductor layer 402 or multiple vertically spaced semiconductor layers 402, formed over the substrate. Such other stacks may couple to the stack (later to form the fin structure 410), with a portion of the substrate 302 as a semiconductor interface. Thus, when forming the fin structure 410, the semiconductor interface may become the semiconductor cladding layer 602, as shown in FIG. 13, e.g., extending from the substrate 302.

Figure 14:
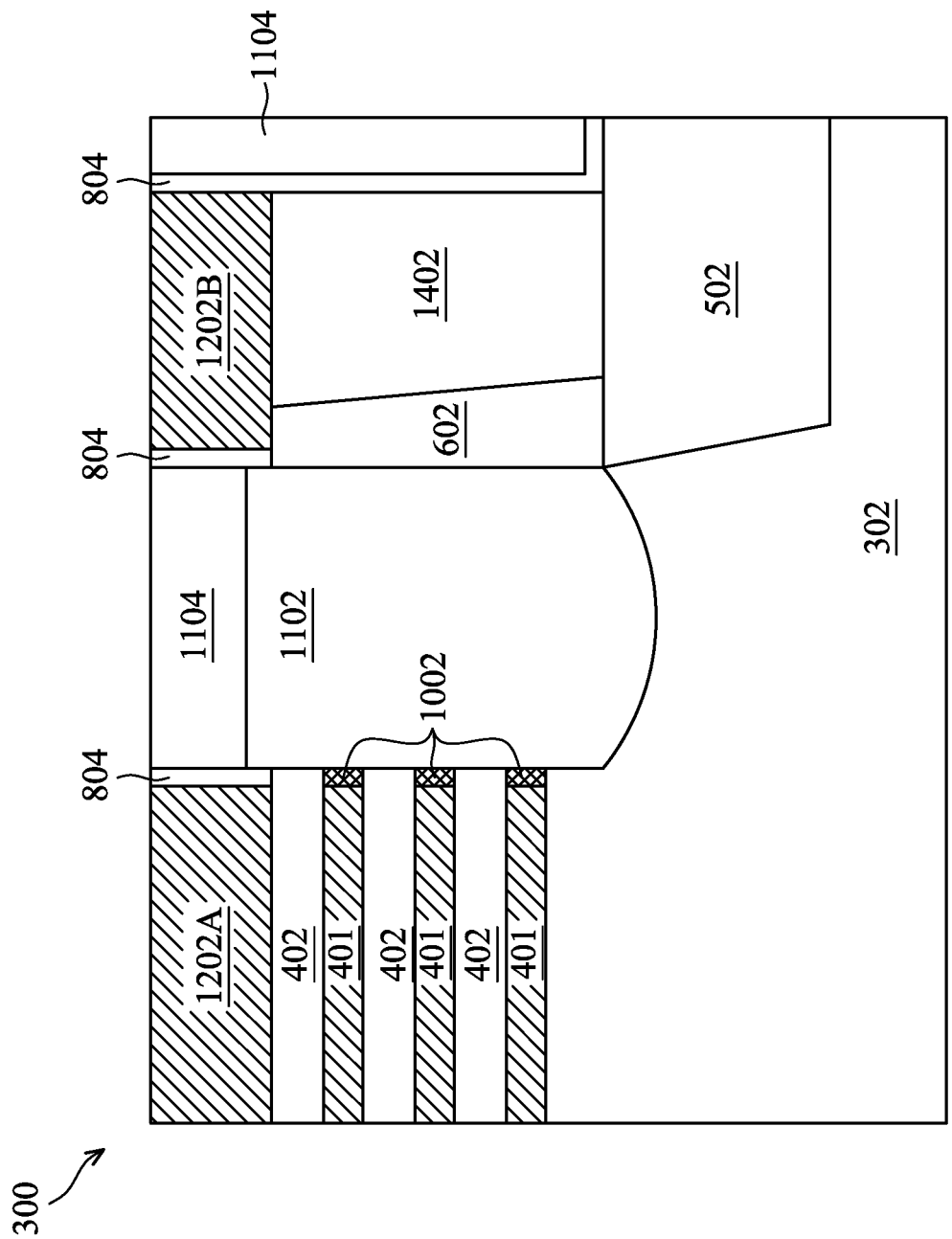

Referring to FIG. 14, the GAA transistor 300 can further include a dummy gate structure 1402, which can be a remaining portion of the dummy gate structure 802B. As such, the semiconductor cladding layer 602 can overlay a first portion of the top surface of the STI 502, and the dummy gate structure 1402 can overlay a second portion of the top surface of the STI 502. In some embodiments, respective top surfaces of the semiconductor cladding layer 602 and the dummy gate structure 1402 can level with each other, which causes the inactive gate structure 1202B to be in contact with such a coplanar top surface, as shown in FIG. 14.

Figure 15:
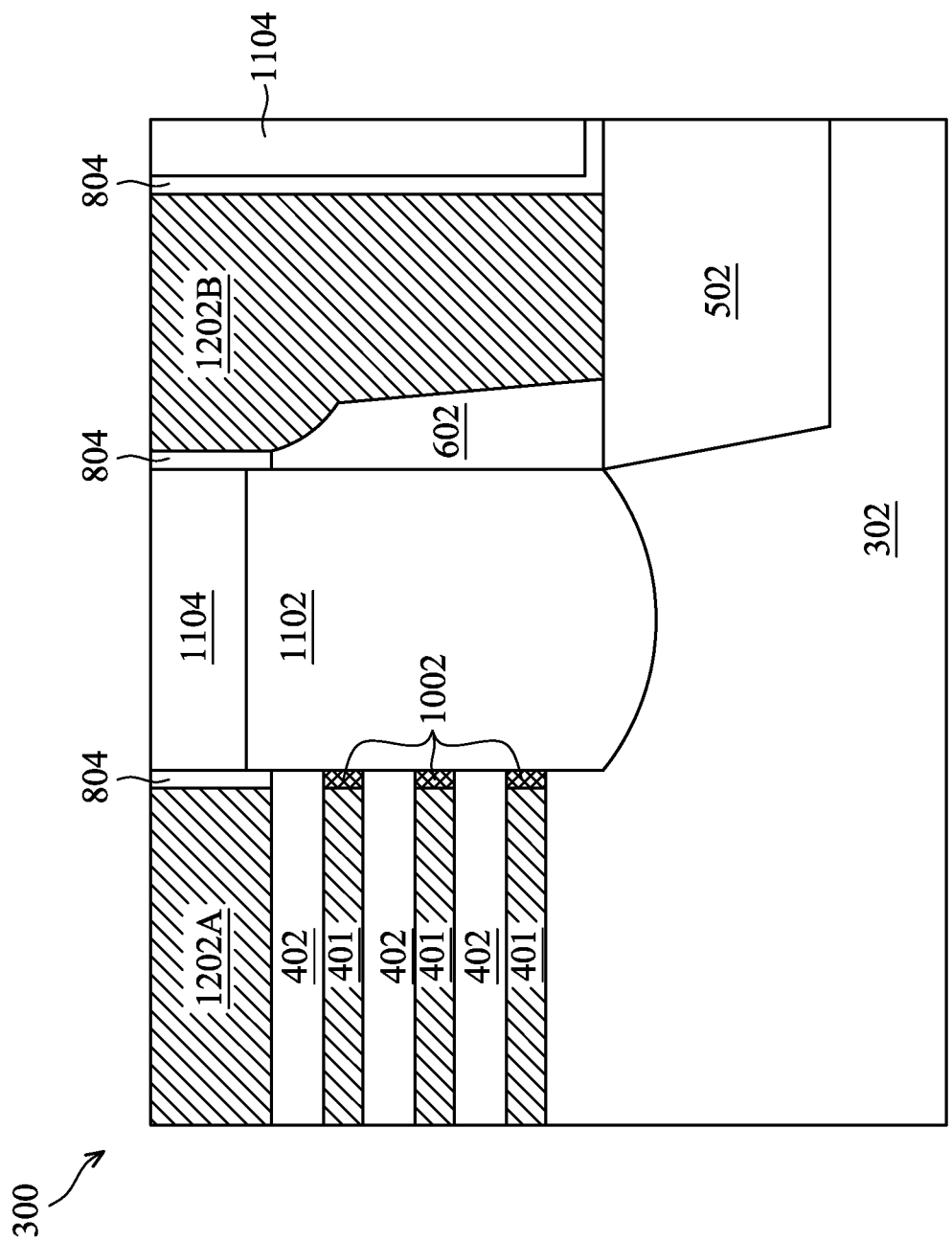

Referring to FIG. 15, the semiconductor cladding layer 602 can have a non-planar top surface. In some embodiments, such a non-planar top surface of the semiconductor cladding layer 602 can be formed during the etching process 701 (e.g., operation 210 of FIG. 2), or during the process of removing the dummy gate structure 802B (e.g., FIG. 12). Although in the illustrated example of FIG. 15, the non-planar top surface includes a curvature-based top surface that has a single arc, it should be understood that the non-planar top surface can have any number of arcs (e.g., some of which inwardly protrude and some of which outwardly protrude), while remaining within the scope of the present disclosure. Further, the non-planar top surface can have any number of valleys (e.g., an edge-based top surface), in some other embodiments.

Figure 16:
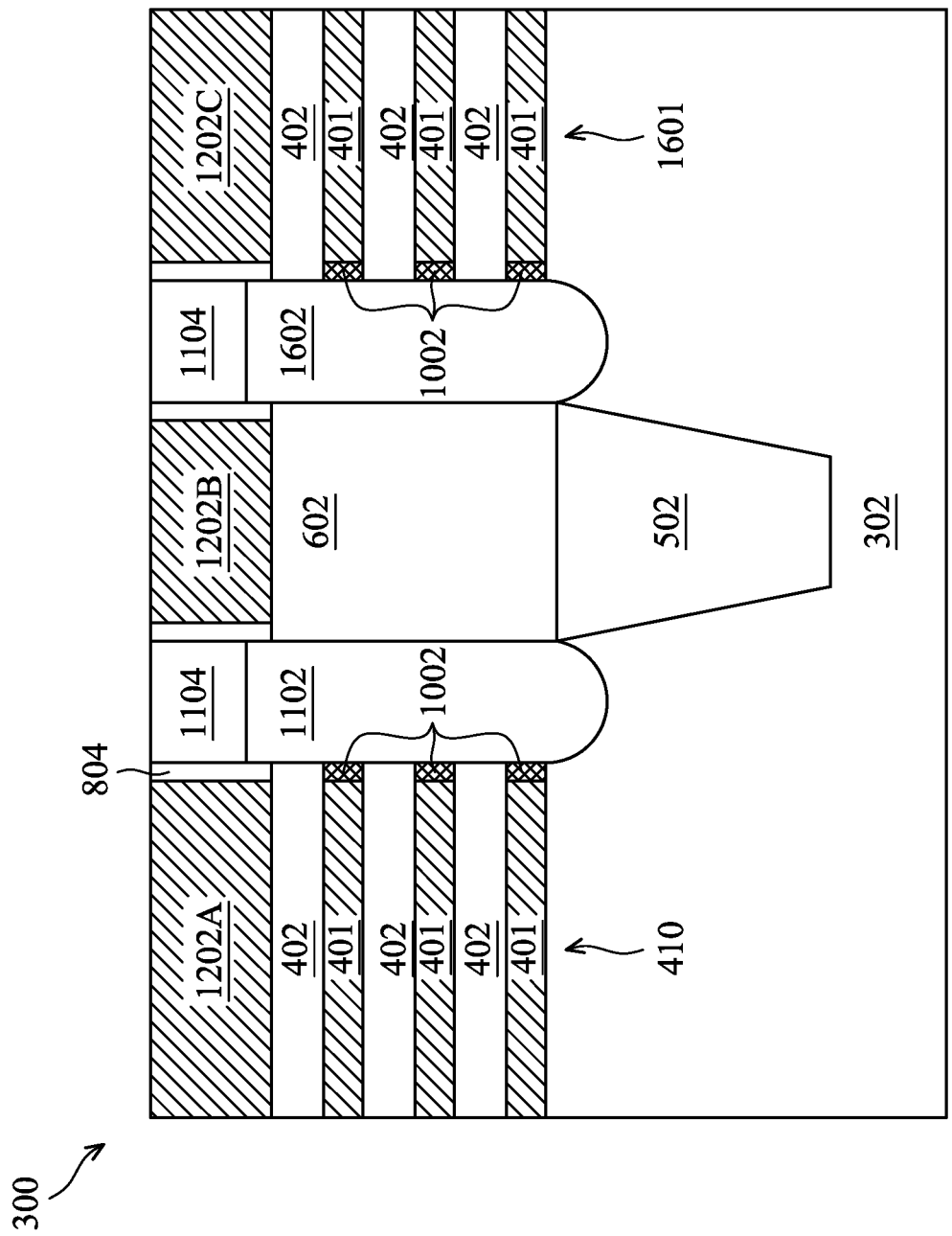

Referring then to FIG. 16, the GAA transistor 300 can further include another fin (or stack) structure of the semiconductor layers 402 (e.g., 1601) that is laterally spaced apart from the stack (or fin) structure 410. In some embodiments, the stack 1601 may mirror from the fin structure 410 with respect to the semiconductor cladding layer 602. As shown, coupled to the semiconductor layers 402 of the stack structure 1601, a source/drain structure 1602 is formed. Such a source/drain structure 1601 can be formed in similar techniques as the source/drain structure 1102, e.g., through epitaxially growth along asymmetric sidewalls of a source/drain recess. Further, the GAA transistor 300 can further include another active (e.g., metal) gate structure wrapping around each of the semiconductor layers 402 of the stack structure 1601.

In one aspect of the present disclosure, a semiconductor device is disclosed. The semiconductor device includes a substrate. The semiconductor device includes a first plurality of channel layers disposed over the substrate, wherein the first plurality of channel layers all extend along a first direction and are vertically spaced from each other. The semiconductor device includes a first active gate structure that extends along a second direction perpendicular to the first direction and wraps around each of the first plurality of channel layers. The semiconductor device includes a first source/drain structure that includes a first sidewall and a second sidewall facing toward and away from the first direction, respectively. The semiconductor device includes a semiconductor cladding layer, integrally formed as a one-piece structure, that extends across the first plurality of channel layers. The first source/drain structure is coupled to each of the first plurality of channel layers through the first sidewall of the first source/drain structure and to the semiconductor cladding layer through the second sidewall of the first source/drain structure.

In another aspect of the present disclosure, a semiconductor device is disclosed. The semiconductor device includes an active gate structure extending along a first lateral direction. The semiconductor device includes an inactive gate structure also extending along the first lateral direction. The semiconductor device includes a first epitaxial structure disposed between the active gate structure and the inactive gate structure along a second lateral direction perpendicular to the first lateral direction. The active gate structure wraps around each of a plurality of channel layers that extend along the second direction, and the inactive gate structure straddles a semiconductor cladding layer that continuously extends along a first sidewall of the first epitaxial structure and across the plurality of channel layers.

In yet another aspect of the present disclosure, a method for making a semiconductor device is disclosed. The method includes forming a fin structure that extends along a first direction. The fin structure includes a plurality of channel layers and a plurality of sacrificial layers alternately stacked on top of one another. The method includes forming a semiconductor cladding layer that extends along a sidewall of the fin structure. The method includes etching a first portion of the fin structure, thereby exposing a sidewall of the semiconductor cladding layer. The method includes epitaxially growing a source/drain structure from the channel layers of a second portion of the fin structure and the semiconductor cladding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first plurality of channel layers disposed over the substrate, wherein the first plurality of channel layers extend along a first direction and are vertically spaced from each other;
   a first active gate structure that extends along a second direction perpendicular to the first direction and wraps around each of the first plurality of channel layers;
   a first source/drain structure that includes a first sidewall and a second sidewall facing toward and away from the first direction, respectively;
   a semiconductor cladding layer, integrally formed as a one-piece structure, that extends across the first plurality of channel layers;
   wherein the first source/drain structure is coupled to each of the first plurality of channel layers through the first sidewall of the first source/drain structure and to the semiconductor cladding layer through the second sidewall of the first source/drain structure;
   an isolation structure that extends into the substrate and is laterally disposed opposite the first active gate structure from the first source/drain structure; and
   an inactive gate structure that also extends along the second direction and is vertically disposed over the isolation structure and the semiconductor cladding layer.

2. The semiconductor device of claim 1, wherein the semiconductor cladding layer includes a material selected from the group consisting of silicon and silicon germanium.

3. The semiconductor device of claim 1, wherein a bottom surface of the semiconductor cladding layer is in contact with a portion of a top surface of the isolation structure, and first and second sidewalls of the semiconductor cladding layer are in contact with the first source/drain structure and the inactive gate structure, respectively.

4. The semiconductor device of claim 1, wherein a lower portion of a first sidewall of the semiconductor cladding layer is in contact with a sidewall of the isolation structure, and respective upper portions of the first sidewall and a second sidewall of the semiconductor cladding layer are in contact with the first source/drain structure and the inactive metal gate structure, respectively.

5. The semiconductor device of claim 1, wherein a bottom surface of the semiconductor cladding layer is in contact with a first portion of a top surface of the isolation structure, and first and second sidewalls of the semiconductor cladding layer are in contact with the first source/drain structure and a remaining portion of a dummy gate structure, respectively, and wherein the remaining portion of the dummy gate structure is in contact with a second portion of the top surface of the isolation structure.

6. The semiconductor device of claim 1, wherein a bottom surface of the semiconductor cladding layer is in contact with a portion of a top surface of the isolation structure, first and second sidewalls of the semiconductor cladding layer are in contact with the first source/drain structure and the inactive gate structure, respectively, and a top surface of the semiconductor cladding layer has a curvature-based surface.

7. The semiconductor device of claim 1, further comprising:
 a second plurality of channel layers disposed over the substrate, wherein the second plurality of channel layers all extend along the first direction and are vertically spaced from each other;
 a second active metal gate structure that extends along the second direction and wraps around each of the second plurality of channel layers; and
 a second source/drain structure that includes a first sidewall and a second sidewall along the first direction.

8. The semiconductor device of claim 7, wherein the second source/drain structure is coupled to each of the second plurality of channel layers through the first sidewall of the second source/drain structure and to the semiconductor cladding layer along through the second sidewall of the second source/drain structure.

9. A semiconductor device, comprising:
 an active gate structure extending along a first lateral direction;
 an inactive gate structure also extending along the first lateral direction; and
 a first epitaxial structure disposed between the active gate structure and the inactive gate structure along a second lateral direction perpendicular to the first lateral direction;
 wherein the active gate structure wraps around each of a plurality of channel layers that extend along the second direction, and the inactive gate structure straddles a semiconductor cladding layer that continuously extends along a first sidewall of the first epitaxial structure and across the plurality of channel layers.

10. The semiconductor device of claim 9, wherein the semiconductor cladding layer and each of the plurality of channel layers include a same semiconductor material.

11. The semiconductor device of claim 9, wherein the first epitaxial structure contacts each of the plurality of channel layers through a second sidewall of the first epitaxial structure, the second sidewall opposite to the first sidewall.

12. The semiconductor device of claim 9, further comprising a shallow trench isolation (STI) structure vertically disposed below the inactive gate structure.

13. The semiconductor device of claim 12, wherein the inactive gate structure contacts a top surface and a sidewall of the semiconductor cladding layer, and a first portion of a top surface of the STI structure.

14. The semiconductor device of claim 13, wherein a bottom surface of the semiconductor cladding layer contacts a second portion of the top surface of the STI structure.

15. The semiconductor device of claim 13, wherein a lower portion of the semiconductor cladding layer extends into the STI structure.

16. The semiconductor device of claim 12, wherein the inactive gate structure contacts a top surface of the semiconductor cladding layer and a top surface of a dummy gate structure, and wherein the semiconductor cladding layer and the dummy gate structure are disposed above the STI structure.

17. A semiconductor device, comprising:
 an active gate structure extending along a first lateral direction and wrapping around each of a plurality of channel layers; and
 an inactive gate structure extending along the first lateral direction,
 wherein a first epitaxial structure is disposed between the active gate structure and the inactive gate structure along a second lateral direction perpendicular to the first lateral direction.

18. The semiconductor device of claim 17, wherein the inactive gate structure straddles a semiconductor cladding layer that continuously extends along a first sidewall of the first epitaxial structure and across the plurality of channel layers that extend along the second lateral direction.

19. The semiconductor device of claim 18, wherein the semiconductor cladding layer includes a material selected from the group consisting of silicon and silicon germanium.

20. The semiconductor device of claim 18, wherein the semiconductor cladding layer and each of the plurality of channel layers include a same semiconductor material.

* * * * *